(12) United States Patent
Luo

(10) Patent No.: US 6,842,053 B1
(45) Date of Patent: Jan. 11, 2005

(54) REDUCED CHARGE INJECTION IN CURRENT SWITCH

(75) Inventor: Wenzhe Luo, Allentown, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/188,241

(22) Filed: Nov. 9, 1998

(51) Int. Cl.[7] .............................................. H03K 17/16
(52) U.S. Cl. ...................................... 327/111; 327/389
(58) Field of Search ................................ 327/111, 384, 327/389, 108; 326/26, 27, 28; 323/313

(56) References Cited

U.S. PATENT DOCUMENTS

| | | | | |
|---|---|---|---|---|
| 5,343,196 A | * | 8/1994 | Harston | 341/136 |
| 5,548,288 A | * | 8/1996 | Lueng | 327/433 |
| 5,635,935 A | * | 6/1997 | Ignowski et al. | 327/544 |
| 6,005,433 A | * | 12/1999 | Hale | 327/379 |
| 6,137,275 A | * | 10/2000 | Ravon | 323/274 |

* cited by examiner

Primary Examiner—Timothy P. Callahan
Assistant Examiner—Terry L. Engluind

(57) ABSTRACT

A current switching circuit has greatly reduced charge injection effects with the introduction of a mirror path to mirror the switch path. The mirror path comprises a complementary switch and a pulling amplifier, e.g., a pull-down amplifier for a source current switching circuit, or a pull-up amplifier for a sink current switch circuit. The pulling amplifier mirrors the status of an output path of a current source, e.g., a transistor current source, such that when the current source is switched ON or OFF, the switching process with respect to the load, e.g., a load capacitor, is smooth and provides a clean current waveform due to greatly reduced charge injection.

17 Claims, 6 Drawing Sheets

REDUCED CHARGE INJECTION IN CURRENT SWITCH

BACKGROUND OF THE INVENTION

1. Field of the Invention

This invention relates generally to metal oxide semiconductor (MOS) switch circuit design. More particularly, it relates to a MOS current switch circuit design which provides a cleaner pulse current waveform due to a smaller amount of charge injection from the current source into the MOS switch.

2. Background of Related Art

A MOS current switch is a basic building block in analog design applications. A conventional MOS switch circuit is shown in FIG. 1.

In particular, FIG. 1 shows an example of a pull-up current switch circuit including a MOS transistor current source MC, a MOS transistor switch MS, and a charging or load capacitor CL. While the current source MC and the switch MS are shown as p-channel MOS field effect transistors (PMOSFETs), the principles of the present invention are equally applicable to the use of other transistors, e.g., to n-channel MOS field effect transistors (NMOSFETs).

As a switch, the MOS transistor switch MS is turned ON when operated at saturation based on a gate voltage S. In operation, the load capacitor CL is charged by the current source MC when the switch MS is ON or conducting, and stores a charge when the switch MS is OFF or not conducting isolate the load capacitor CL from the current source MC.

Charge injection can cause undesirable spikes in a current signal to the load, e.g., to the load capacitor CL. Undesirable charge is injected into the load capacitor CL shown in the circuit of FIG. 1 whenever the switch MS is switched ON or OFF.

Charge injection arises from multiple sources. For instance, when switching, the switch MS itself receives charges from the load capacitor CL to form an inversion layer. Some of these charges may be received from the load capacitor CL. More seriously, when the current source MC enters its saturation from a triode state, minority carriers from the inversion layer of the current source MC may be injected into the load capacitor CL through the switch MS. This second example is much more serious than the first because the size and/or capacity of the current source transistor MC is typically always much larger than that of the switch MS. In either case, non-uniform current may result to the load, e.g., the load capacitor CL.

The effects of charge injection are intrinsic to the design of MOS current switch circuits, e.g., complementary MOS circuits, which are a basic building block for many analog designs. Unfortunately, because of charge injection, undesired charge may be injected from the switch transistor and/or the current source into the load which the current source is serving. This typically causes a significant peak in the current output to the load, directly affecting the operation of the load, e.g., a load capacitor.

Currently there is no ideal technique to sufficiently reduce charge injection in this type circuit.

For instance, one conventional technique to reduce charge injection in a current switching circuit includes a MOS transistor switch MS above a MOS transistor current source MC, e.g., as shown in FIG. 2. Such a circuit typically does reduce charge injection which might otherwise be injected when the switch MS is turned ON. Unfortunately, such a circuit exhibits a large "dead zone" problem causing significant delays in the provision of the current after the switch MS is turned ON. Thus, when the switch MS is turned ON, it must first charge the transistor current source MC, which is typically a large transistor requiring a significant period of time to establish an inversion layer. During the period of time that the current source MC is charging, there is no or little current output to the load, e.g., to the load capacitor CL. Thus, during this period, the output current waveform to the load capacitor CL is rather undesirable. Even more seriously, the circuit of FIG. 2 nevertheless suffers from a significant charge injection caused when the switch MS is turned OFF. At this time, all of the inversion layer charge in the current source MC is injected into the load, e.g., to the load capacitor CL.

Another conventional technique to reduce charge injection in a current switch circuit is to provide a compensated switch MS as shown in FIG. 3.

FIG. 3 shows a functional transistor pair 304a, 304b surrounded by compensating transistor pairs 302a, 302b and 306a, 306b on respective sides of the functional transistor pair 304a, 304b. As shown in FIG. 3, the upper transistors 302b, 304b and 306b are PMOS transistors, while the lower transistors 302a, 304a and 306a are NMOS transistors. The two lower compensating transistors 302a, 306a and the upper functional transistor 304b are turned ON and OFF by the voltage level of signal S, while the upper two compensating transistors 302b, 306b and the lower functional transistor 304a are turned on by an inverted signal /S.

The numbers "0.5", "1.0" and "0.5" adjacent the first compensating transistor pair 302a, 302b, the functional transistor pair 304a, 304b, and the second compensating transistor pair 306a, 306b, represent that the compensating transistors on either side of the functional transistor are half size dummy transistors used to cancel any potential charge injection cancellation.

Compensated switches as shown in FIG. 3 are commonly used in the design of switches in analog circuits. Unfortunately, even the use of compensated switches do not solve the problem of charge injection completely. For instance, the current source MC is typically much larger than the switch MS, and thus charge injected from current source MC is the main component of the charge injection (normally more than 90%), not the switch MS itself. Thus, even by implementing a compensated switch MS as shown in FIG. 3, a significant amount of the charge injection (e.g., more than 90%) still remains. Another problem is that when the switch MS is turned ON, the drain-source voltage (e.g., Vdd-Vo in FIG. 2) is quite large, and the electric field across the channel is very strong. Thus, the compensated charge injection cannot be canceled very well. There is thus a need for a current switching circuit design which greatly reduces or eliminates charge injection to a load.

SUMMARY OF THE INVENTION

In accordance with the principles of the present invention, a current source switching circuit with reduced charge injection comprises a transistor switch, and a pulling mirror path in parallel with the transistor switch.

A method of reducing charge injection from a current source through a current switch into a load in accordance with another aspect of the present invention comprises providing a mirror path in parallel with the current switch. A switch in the mirror path is turned on when the current switch is turned off. The switch in the mirror path is turned off when the current switch is turned on.

A method of switching a current source out from a load in accordance with yet another aspect of the present invention comprises opening a transistor switch connecting the current source to the load. Substantially simultaneously with the step of opening, a switch to a mirror path in parallel with the transistor switch is closed so that current from the current source flows through the mirror path. This greatly reduces charge injection from the current source to the load when the transistor switch is opened.

BRIEF DESCRIPTION OF THE DRAWINGS

Features and advantages of the present invention will become apparent to those skilled in the art from the following description with reference to the drawings, in which.

DETAILED DESCRIPTION OF ILLUSTRATIVE EMBODIMENTS

The present invention provides a current switch circuit having greatly reduced charge injection effects with the introduction of a mirror path to mirror the switch path. The mirror path comprises a complementary switch and a pulling amplifier, e.g., a pull-down amplifier for a source current switching circuit, or a pull-up amplifier for a sink current switch circuit.

The pulling amplifier mirrors the status of an output path of a current source, e.g., transistor current source MC in a complementary mirror path such that when the current source is switched ON or OFF, the switching process with respect to the load, e.g., the load capacitor CL, is smooth and provides a clean current waveform due to greatly reduced charge injection.

Figure 4:
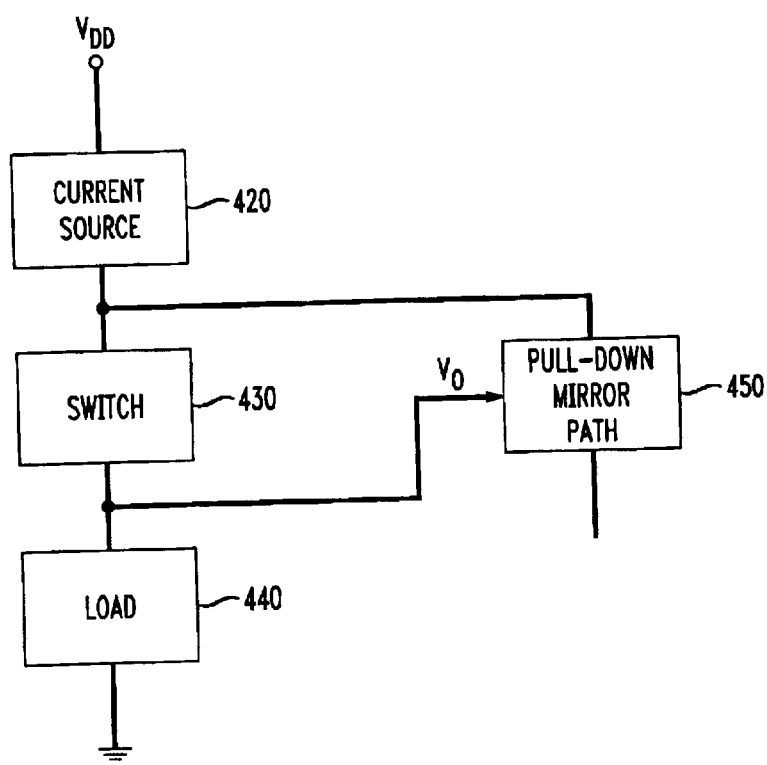
FIG. 4 shows a block diagram of a pull-down mirror path to greatly eliminate charge injection from a current source to a load, in accordance with the principles of the present invention.

FIG. 4 shows a block diagram of a pull-down mirror path to greatly eliminate charge injection from a current source to a load, in accordance with the principles of the present invention.

In particular, a current switching circuit includes a serial path between a current source 420, a switch 430, and a load 440. However, the current switching circuit additionally includes a pull-down mirror path 450 to greatly eliminate charge injection from the current source 420 into the load 440 when the switch 430 isolates the output of the current source 420 from the load 440. A voltage out Vo signal is provided to the pull-down mirror path 450 for reference.

Figure 5:
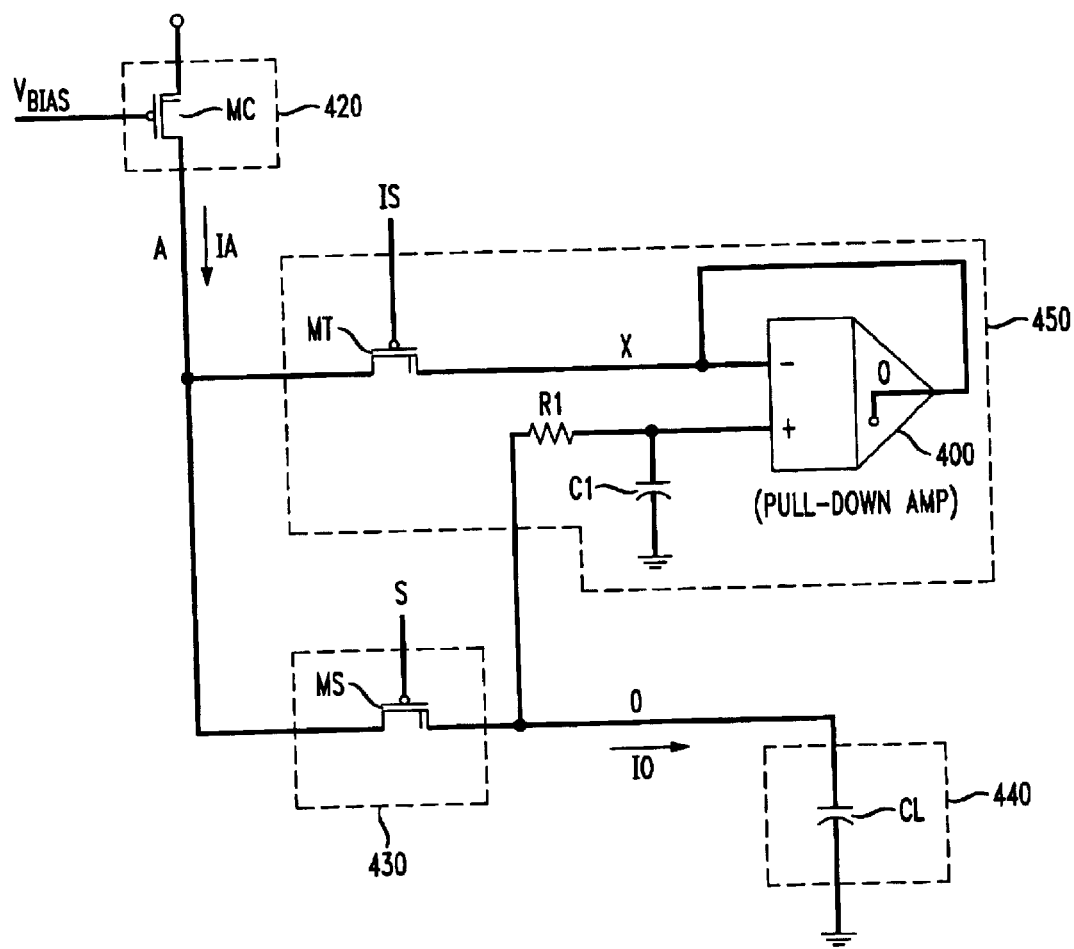
FIG. 5 shows a schematic of a source current switching circuit including a pull-down mirror path to greatly eliminate charge injection from a current source into a load, in accordance with the principles of the present invention.

FIG. 5 shows a schematic of a source current switching circuit including a pull-down mirror path to greatly eliminate charge injection from a current source into a load, in accordance with the principles of the present invention.

In particular, the current source 420 in the disclosed embodiment comprises a PMOSFET MC, and the switch 430 comprises a PMOSFET MS.

Of course, the principles of the present invention relate equally to the use of other types of transistors as well, e.g., NMOS transistors. The load 440 may be any suitable component depending upon the application. For instance, the exemplary load shown in FIG. 5 is a capacitor CL.

Figure 6A:
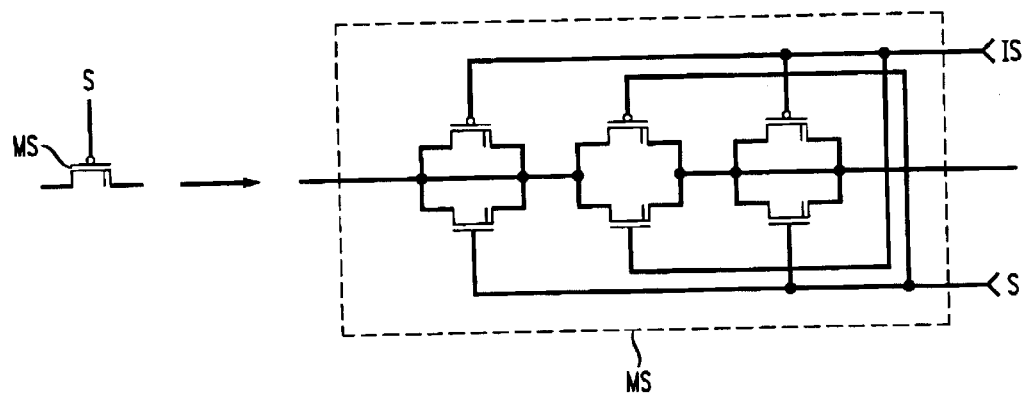
FIGS. 6A and 6B show the formation of an exemplary compensating transistor switch and an exemplary compensating mirror path transistor switch, respectively, for the circuit shown in FIG. 5, in accordance with the principles of the present invention.
Figure 6B:
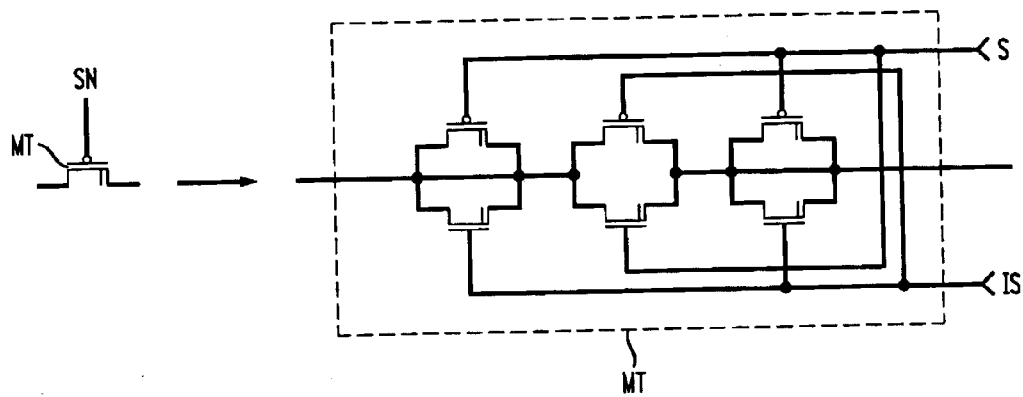

The pull-down mirror path 450 in the exemplary embodiment comprises a switch MT which is complementary to the switch MS. Thus, while a signal S controls the ON/OFF switching of the switch MS, an inverted signal /S controls the OFF/ON switching of the mirror path switch MT. In the exemplary embodiments, the switch MS and the mirror path switch MT are each compensated switches as shown in FIGS. 6A and 6B, respectively. Of course, the principles of the present invention relate to other types of transistor switches, compensated or non-compensated.

The positive input of the pull-down amp 400 is connected to the load side of the switch MS through an input resistor R1 and an input capacitor C1, while the negative input to the pull-down amp 400 is connected to one side of the mirror path switch MT. The other side of the mirror path switch MT is connected to the current source side of the switch MS.

The positive input of the pull-down amp 400 is connected to the load side of the switch MS through an input resistor R1 and an input capacitor C1, while the negative input to the pull-down amp 400 is connected to one side of the mirror path switch MT. The other side of the mirror path switch MT is connected to the current source side of the switch MS.

Figure 1:
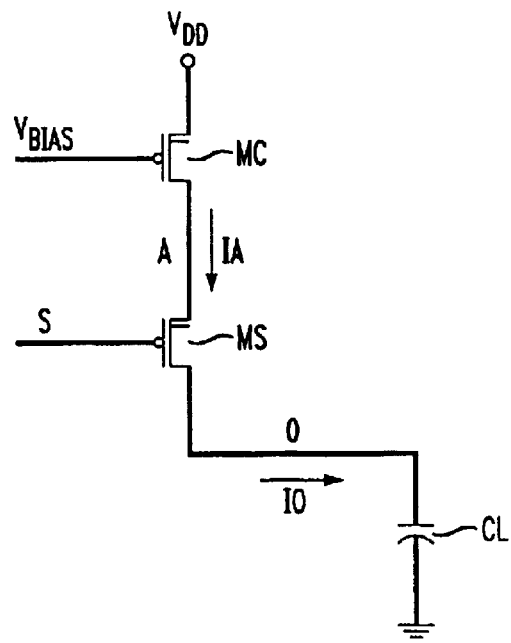
FIG. 1 shows one conventional current switching circuit including a transistor current source connected to a power source and a transistor switch connecting the transistor current source with a load.
Figure 2:
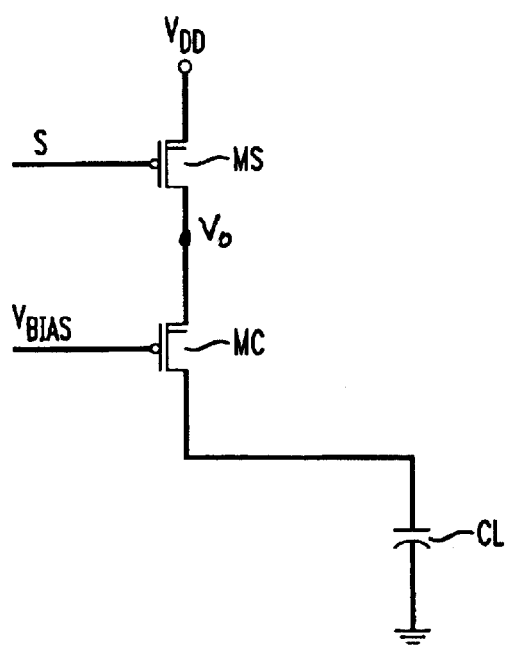
FIG. 2 shows another conventional current switching circuit including current source which is connected to a power source through a transistor switch.
Figure 3:
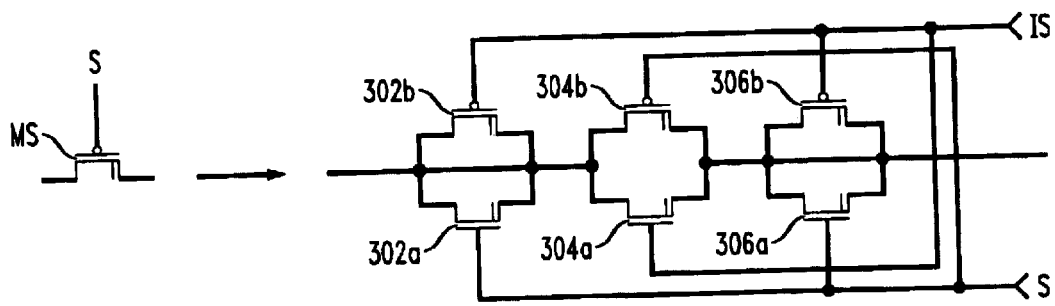
FIG. 3 shows a compensated transistor switch comprising a functional transistor surrounded by compensating transistor switches.

The transistor current source MC may comprise one or more transistors, e.g., as in a cascaded current source. The transistor current source MC provides a current IA as controlled by a biasing voltage VBIAS to the gate of the transistor current source MC. When the switch MS is turned ON, the current IA from the current source MC flows to the load 440 through the switch MS otherwise as in a conventional current switching circuit, e.g., as shown in FIGS. 1–3. However, when the switch MS is turned OFF, the current IA from the current source MC flows through the pull-down mirror path 450.

The control signals S and /S are complementary to the switch MS and mirror path switch MT, respectively, and thus when the path connecting the current source MC to the load capacitor CL is closed through the switch MS, the mirror path is open, and vice versa.

Using the mirror path 450, the current IA output from the current source MC constantly flows, either through the switch MS to the load capacitor CL, or to the mirror path 450. Thus, the magnitude of the current source MC is substantially constant whether or not driving the load 440. Moreover, the voltage at node A (i.e., at the output of the current source MC) remains substantially unchanged before and after the switch MS is turned ON or OFF.

Accordingly, the current source MC remains substantially constant whether or not it is passing current through the switch MS to the load 440. Thus, because the charge is substantially unchanged as the switch MS turns ON or OFF, undesirable charge injection is avoided from the current source MC.

The principles of the present invention also provide a well balanced drain-source voltage of the transistor switch MS even before the switch MS is turned ON, to further reduce the effects of charge injection.

The advantages of the use of a mirror path to greatly eliminate charge injection from a current source (or sink) are discussed through a comparison of current switching circuits with and without a mirror path.

(1) Without a Mirror Path

Without the path X shown in FIG. 5, the current IA only flows when the switch MS is turned ON. When the switch MS is turned OFF, the output node A of the current source MC will be charged to the voltage level of the power source Vdd. In this case, the current source MC won't pass any current simply because Vds=0. In this case, the current source MC is solidly in its triode region and thus stores a significant number of holes in its inversion layer.

The amount of charge in the inversion layer is calculated by:

$$Q_1 = WLC_{ox}(V_{dd} - V_{tp} - V_{bias})$$

W is the width of the inversion layer, L is the length of the inversion layer and $C_{ox}$ is the capacitance of a unit area of the oxide layer. Now, when the switch MS is switched on, the voltage at node A is pulled down from Vdd to more substantially the level of node 0. The current source MC leaves its triode region and enters saturation. During the transition time when the current source MC enters saturation, holes are injected from node A to the load capacitor CL causing charge injection. Eventually, the current source MC has a charge in its inversion layer calculated as follows:

$$Q_2 = (2/3)WLC_{ox}(V_{dd} - V_{tp} - V_{bias})$$

W is the width of the inversion layer, L is the length of the inversion layer and $C_{ox}$ is the capacitance of a unit area of the oxide layer. The difference in these calculations, i.e., $Q_1-Q_2$, provides an approximation of the undesirably injected charges.

During the transition time, because of the voltage imbalance between both ends of the switch MS, the charge injection due to the switch MS would not be evenly distributed between both ends (i.e., source and drain), making it difficult to cancel even with a compensated switch.

(2) With the Mirror Path

As shown in the FIG. 5, the exemplary pull-down amplifier 400 is configured as a follower. Thus, the pull-down amplifier 400 receives a reference from its output node and makes the voltage of node X follow that at the output of the pull-down amplifier 400.

When the switch MS is turned OFF, the mirror switch MT is turned ON, and the current IA output from the current source MC follows into the output of the pull-down amplifier 400 via node X. At the same time, a balance is established so that Vx=Vo if the mirror switch MT is switched ON for sufficient time, which is normally the case.

When the switch MS is turned ON, the current IA output from the current source MC is diverted to the load path 0, to drive the load capacitor CL. Note that at the transition time, Vx=Vo and the two switches MS and MT are substantially identical. In this case, the current source output will not change and therefore will not inject undesirable charges into the load capacitor CL. Accordingly, charge injection is greatly reduced or eliminated with the use of a mirror path in accordance with the principles of the present invention.

At the same time, when the switches MS and MT are turned ON or OFF, the electrical field across the respective switches is reduced. For instance, when the switch MS is turned ON, the node A is at a level closer to Vx or Vo than to Vdd as in conventional circuits. This allows an even distribution of the charges about the drain and source of the switch MS, allowing a compensated switch, e.g., as shown in FIG. 6A, to provide adequate compensation for any remaining charge.

Figure 7:
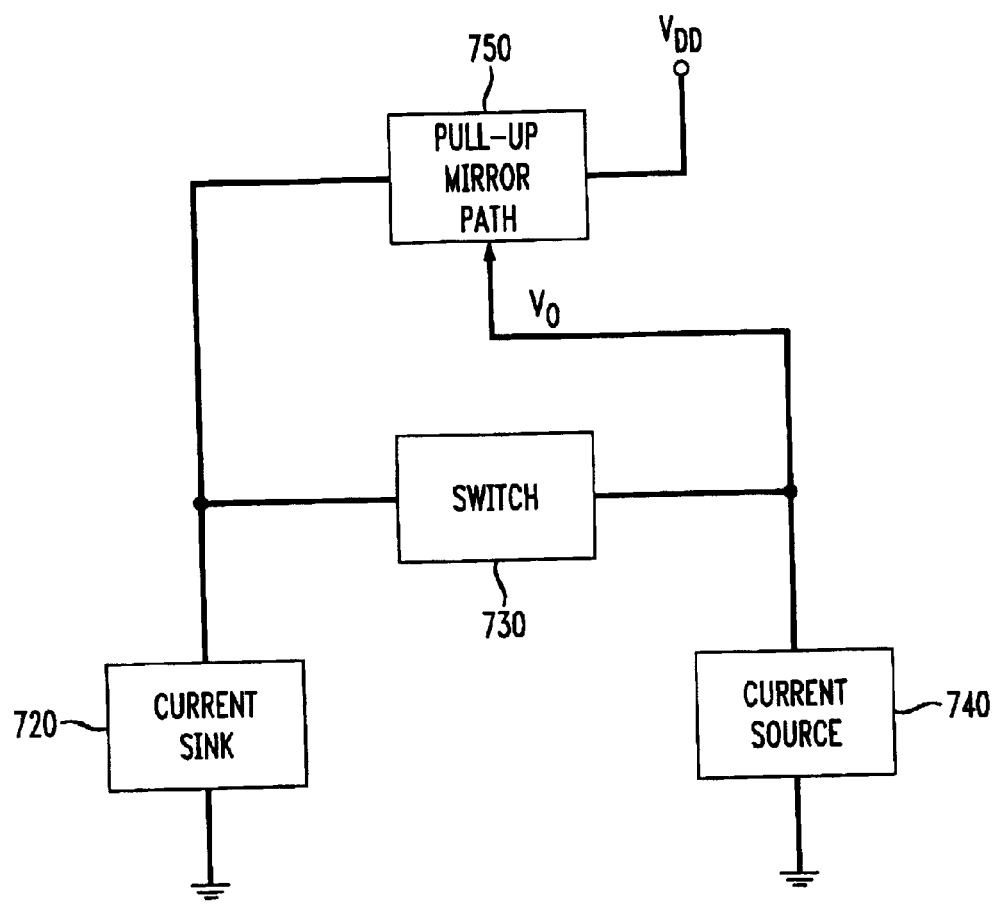
FIG. 7 shows a block diagram of a pull-up mirror path in a sink current switching circuit to greatly eliminate charge injection to a load, in accordance with another embodiment of the present invention.

The present invention is applicable to other types of current switching circuits. For instance, FIG. 7 shows a block diagram of the use of a pull-up mirror path in a sink current switching circuit to greatly eliminate charge injection to a load, in accordance with another embodiment of the present invention.

In particular, a current sink 720 accepts current from a current source 740, with a transistor switch 730 there between. In accordance with the principles of the present invention, a mirror path (i.e., a pull-up mirror path) 750 is placed in parallel with the current switch 730. The voltage out signal Vo is provided to the pull-up mirror path 750 for reference. One example of a sink current switching circuit is shown in detail in FIG. 8.

Figure 8:
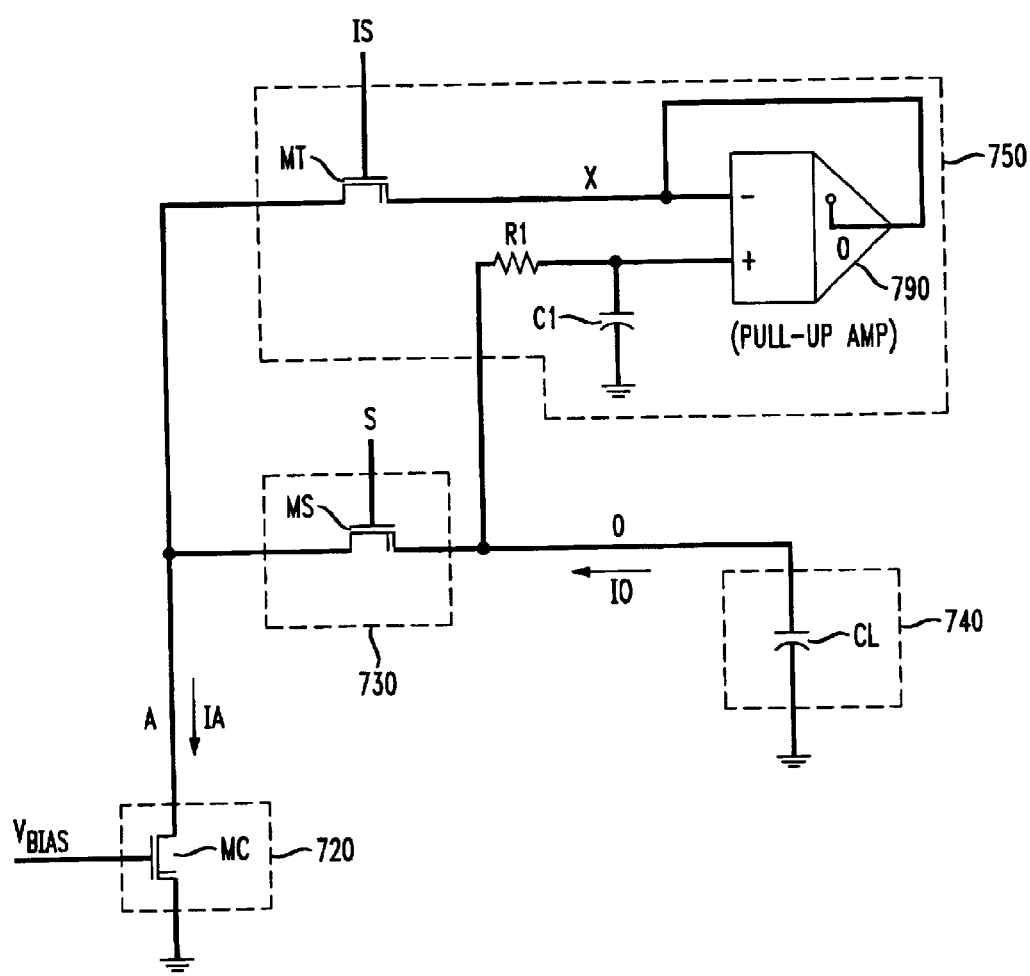
FIG. 8 shows a schematic of a sink current switching circuit including a pull-up mirror path to greatly eliminate charge injection from a current source into a load, in accordance with another embodiment of the present invention.

In particular, FIG. 8 shows a current switch MS as in the circuit shown in FIG. 5. However, the transistor MC serves to sink current sourced by the capacitor CL. In this case, the mirror path 750 is configured as a pull-up mirror path.

The pull-up mirror path comprises a pull-up amplifier 790 and a mirror transistor switch MT, e.g., an NMOSFET. The positive input of the pull-up amplifier 790 is connected to the source (i.e., capacitor CL) side of the switch MS, via a suitable resistor R1 and capacitor C1. The negative input to the pull-up amplifier 790 is connected to the sink, i.e., transistor MC side of the switch MS, via the mirror switch MT. The output of the pull-up amplifier 790 is connected to its negative input.

In accordance with the principles of the present invention, charge injection to a load (in the case of a current source switching circuit) or to a source (in the case of a sink current switching circuit) is greatly reduced or eliminated with the use of a mirror path in parallel with the switching transistor.

The principles of the present invention have wide ranging uses, including use in phase-locked loop (PLL) clock synthesizers and/or frequency synthesizers.

While the invention has been described with reference to the exemplary embodiments thereof, those skilled in the art will be able to make various modifications to the described embodiments of the invention without departing from the true spirit and scope of the invention.

What is claimed is:

1. A current source switching circuit with reduced charge injection, comprising:
    a current source;
    a transistor switch path;
    a pull-down mirror path, comprising an amplifier and a switch controlling current flow to said amplifier, in parallel with said transistor switch path operating to ensure a constant current flow from said current source; and
    a first load;
    wherein said transistor switch path and said pull-down mirror path operate complementary to one another to reduce said charge injection flowing to said first load during switching of said current between said first load and said pull-down mirror path.

2. The current source switching circuit according to claim 1, wherein:
said current source is connected between a power source and a first side of said transistor switch path.

3. The current source switching circuit according to claim 2, further comprising:
said first load connected between a ground and a second side of said transistor switch path.

4. The current source switching circuit according to claim 3, wherein:
said first load is a charging capacitor.

5. The current source switching circuit according to claim 1, wherein said transistor switch path comprises:
a MOS transistor.

6. The current source switching circuit according to claim 1, wherein said transistor switch path comprises:
a first serial combination of a functional MOS transistor with a first compensating transistor connected to a source of said functional MOS transistor and a second compensating transistor connected to a drain of said functional MOS transistor.

7. The current source switching circuit according to claim 6, wherein said transistor switch path further comprises:
a second serial combination of a complementary functional MOS transistor with a first complementary compensating transistor connected to a source of said complementary functional MOS transistor and a second complementary compensating transistor connected to a drain of said complementary functional MOS transistor.

8. The current source switching circuit according to claim 1, wherein:
said amplifier is a pull-down amplifier.

9. The current source switching circuit according to claim 8, wherein:
said pull-down amplifier is configured as a voltage follower to have an output which follows a current source side of said switch.

10. The current source switching circuit according to claim 1, wherein said pull-down mirror path switch comprises:
a series combination of a functional transistor with a respective compensating transistor connected to either side of said functional transistor.

11. The current source switching circuit according to claim 2, wherein said current source comprises:
a MOS transistor.

12. The current source switching circuit according to claim 5, wherein:
said amplifier is a pull-down amplifier.

13. The current source switching circuit according to claim 12, wherein:
said current source is connected between a power source and a first side of said transistor switch path.

14. A method of reducing charge injection from a current source through a current switch into a load, said method comprising:

providing a pull-down mirror path comprising an amplifier and a switch controlling current flow to said amplifier, in parallel with said current switch, said pull-down mirror path and said current switch operating to ensure a stable current flow from said current source to said load when said current switch is switched on;
turning a switch in said pull-down mirror path on when said current switch is turned off; and
turning said switch in said pull-down mirror path off when said current switch is turned on;
wherein said current switch and said pull-down mirror path operate complementary to one another to reduce said charge injection flowing to said load during switching of said current flow between said load and said pull-down mirror path.

15. The method of reducing charge injection from a current source through a current switch into a load according to claim 1, wherein:
said current source is a MOS transistor.

16. A method of switching a current source out from a load, said method comprising:
opening a transistor switch connecting said current source to said load; and
substantially simultaneously with said step of opening, closing a switch in a pull-down mirror path, comprising an amplifier, in parallel with said transistor switch so that current from said current source flows through said pull-down mirror path, said pull-down mirror path and said transistor switch operating complementary to one another to ensure a constant current flow from said current source and to maintain a given current level produced by said current source;
wherein said load receives said current flowing from said current source when said current is switched from said pull-down mirror path to said load thereby reducing charge injection from said current source to said load during said switching of said current between said load and said pull-down mirror path.

17. Apparatus for switching a current source out from a load, comprising:
means for opening a transistor switch connecting said current source to said load; and
means for closing a switch in a pull-down mirror path in parallel with said transistor switch at substantially simultaneously a same time as said means for opening opens said transistor switch so that current from said current source flows through said pull-down mirror path, said pull-down mirror path comprising an amplifier, said pull-down mirror path and said transistor switch operating complementary to one another to ensure a constant current flow from said current source and to maintain a given current level produced by said current source;
wherein said load receives said current flowing from said current source when current is switched from said pull-down mirror path to said load thereby reducing charge injection from said current source to said load during said switching of said current between said load and said pull-down mirror path.

* * * * *